United States Patent
Wong et al.

(10) Patent No.: US 9,606,164 B2
(45) Date of Patent: Mar. 28, 2017

(54) FAULT DETECTION SYSTEM

(71) Applicant: DX TECH PTY LTD, Prahran, Victoria (AU)

(72) Inventors: Khoi Loon Wong, Prahran (AU); Alexe Bojovschi, Mooroolbark (AU)

(73) Assignee: DX TECH PTY LTD (AU)

( * ) Notice: Subject to any disclaimer, the term of this patent is extended or adjusted under 35 U.S.C. 154(b) by 247 days.

(21) Appl. No.: 14/367,463

(22) PCT Filed: Dec. 24, 2012

(86) PCT No.: PCT/AU2012/001608
§ 371 (c)(1),
(2) Date: Jun. 20, 2014

(87) PCT Pub. No.: WO2013/091028
PCT Pub. Date: Jun. 27, 2013

(65) Prior Publication Data
US 2014/0354293 A1     Dec. 4, 2014

(30) Foreign Application Priority Data
Dec. 23, 2011  (AU) ................................ 2011905404

(51) Int. Cl.
*G01R 31/08* (2006.01)
*G01R 31/12* (2006.01)

(52) U.S. Cl.
CPC ........... *G01R 31/088* (2013.01); *G01R 31/08* (2013.01); *G01R 31/1227* (2013.01)

(58) Field of Classification Search
CPC ... G01R 31/1227; G01R 31/08; G01R 31/088
(Continued)

(56) References Cited

U.S. PATENT DOCUMENTS 3,728,620 A * 4/1973 Heins ................... G01R 31/085
                                                                  324/520
4,841,287 A * 6/1989 Flig ........................ F16K 17/36
                                                                  137/39
(Continued)

FOREIGN PATENT DOCUMENTS

AU    WO 2007070942 A1 *  6/2007  ......... G01R 31/1245

OTHER PUBLICATIONS

Khor, K.J., "Partial Discharge Propagation and Sensing in Overhead Power Distribution Lines", School of Electrical and Computer Engineering, College of Science, Engineering and Health, RMIT University, Mar. 2010 [retrieved on Feb. 4, 2013.] Retrieved from the Internet <URL: http://researchbank.mit.edu.au/eserv/rmit:7535/Khor.pdf >.

(Continued)

*Primary Examiner* — Tung X Nguyen
*Assistant Examiner* — Robert P Alejnikov, Jr.
(74) *Attorney, Agent, or Firm* — The Belles Group, P.C.

(57) ABSTRACT

An early fault detection system for a low voltage distribution network including: at least two detectors, each located on one of two power poles at either end of a section of a power distribution line; each detector includes a GPS unit, an uninterruptable power supply, a communication means to send data to a base station, antenna sensors having a bandwidth range of 1 MHz to 3 GHz for each wire in the power line, and a processor receiving signals from each sensor and collecting data relating to a maximum value, a time of maximum value, a minimum value, and a time of minimum value for partial discharge signals within the bandwidth range; and the processor or base station being programmed to analyze the collected data to identify a location of pulses above a predetermined value and record (Continued)

the number of such pulses at each location over a predetermined time interval.

5 Claims, 4 Drawing Sheets

(58) Field of Classification Search
USPC .............................. 324/520, 527; 702/57–59
See application file for complete search history.

(56) References Cited

U.S. PATENT DOCUMENTS

| | | | |
|---|---|---|---|
| 5,295,490 A * | 3/1994 | Dodakian | A61B 5/1135 600/534 |
| 6,798,211 B1 * | 9/2004 | Rockwell | G01R 31/085 324/527 |
| 2007/0059986 A1 * | 3/2007 | Rockwell | G01R 19/2513 439/638 |
| 2008/0077336 A1 * | 3/2008 | Fernandes | G01R 15/142 702/57 |
| 2009/0267615 A1 * | 10/2009 | Jones | G01R 29/0892 324/627 |
| 2010/0231222 A1 * | 9/2010 | Bazinet | G01R 33/04 324/345 |
| 2011/0080283 A1 | 4/2011 | Schweitzer, III et al. | |

OTHER PUBLICATIONS

Corresponding International Search Report dated Feb. 11, 2013.

* cited by examiner

FAULT DETECTION SYSTEM

PRIORITY

Priority is claimed as a national stage application, under 35 U.S.C. §371, to international application No. PCT/AU2012/001608, filed Dec. 24, 2012, which claims priority to Australian application AU2011905404, filed Dec. 23, 2011. The disclosures of the aforementioned priority applications are incorporated herein by reference in their entirety.

This invention relates to a method and apparatus for the early detection of electrical faults in distributed power networks.

BACKGROUND TO THE INVENTION

Insulators bushings and electrical terminations on outdoor power equipment deteriorate over time due to exposure to moisture, pollution, heat and UV radiation. In hot summers degradation of insulators in transmission lines is accelerated leading to an increase in the incidence of structural damage and reduction in dielectric strength. Presently used methods of detection include visual inspection, image intensification, infrared thermography, electric field distribution measurements and acoustic emission measurement. These techniques are only useful in detecting large defects and require inspection, which involves labour time and cost. Australian patent 2006326931 discloses a method of detecting faults in high voltage power lines. The detector has antenna sensors having a bandwidth of 1 MHz to 3 GHz, positioned directly below each line. The detector units are located on each high voltage power pylon. The processing unit includes a processor and a transmitter for communication with a base station. The processor filters the signals from the sensors and segments the signals to find out the time instant when a partial discharge occurs. The signals are subjected to fractal analysis or a Wigner Ville distribution analysis. The processing can be split between the processors at the pylons and the base station It is an object of this invention to provide a system for the early detection of faults in distributed power networks that involves lower labour time and reduced site visits.

BRIEF DESCRIPTION OF THE INVENTION

To this end the present invention provides a system for the early detection of faults in a low voltage distribution network in which at least two detectors are each located on one of two power poles at either end of a section of a power distribution line, each detector includes a GPS unit, an uninterruptable power supply, a communication means to send data to a base station, an electromagnetic sensor or antenna for each conductor in the power line, each sensor having a bandwidth of 1 MHz to 3 GHz, a processor to receive signals from each sensor and collect data relating to the maximum value, time of maximum value, minimum value and time of minimum value for partial discharge signals within the range and the processor or base station being programmed to analyse the collected data to identify location of pulses above a predetermined value and record the number of such pulses at each location over a predetermined time interval to enable identification of likely sites of faults in the distribution line. More than two detectors may be installed into the distribution network to form a mesh network, to increase the coverage of the detection.

The processor may include a data acquisition system or analogue to digital converter and includes software to statistically analyse the signals from each sensor.

The early detection of faults in low voltage distribution networks has been a long standing and previously insoluble problem. This invention reduces the incidence response time.

DETAILED DESCRIPTION OF THE INVENTION

A preferred embodiment of the invention will now be described with reference to the drawings in which.

Figure 1A:
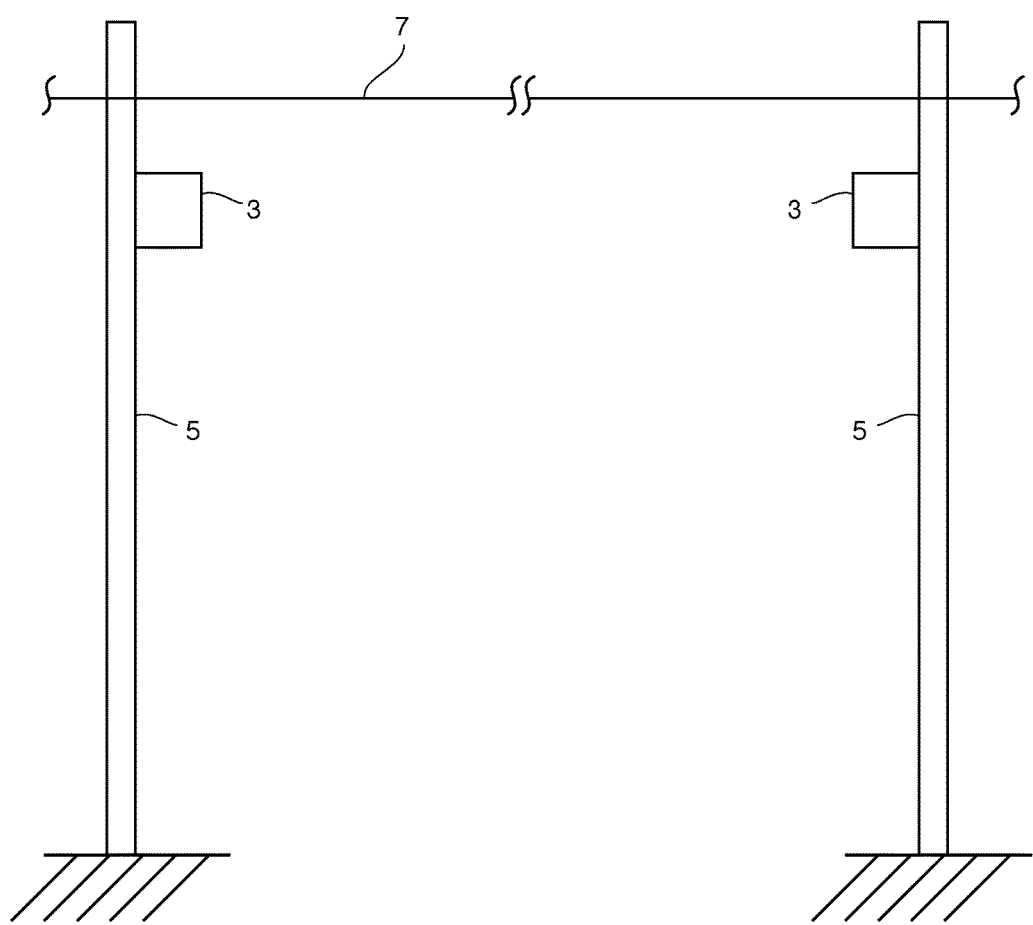
FIG. 1A illustrates a fault detection system mounted to detect faults in a power distribution line.
Figure 1B:
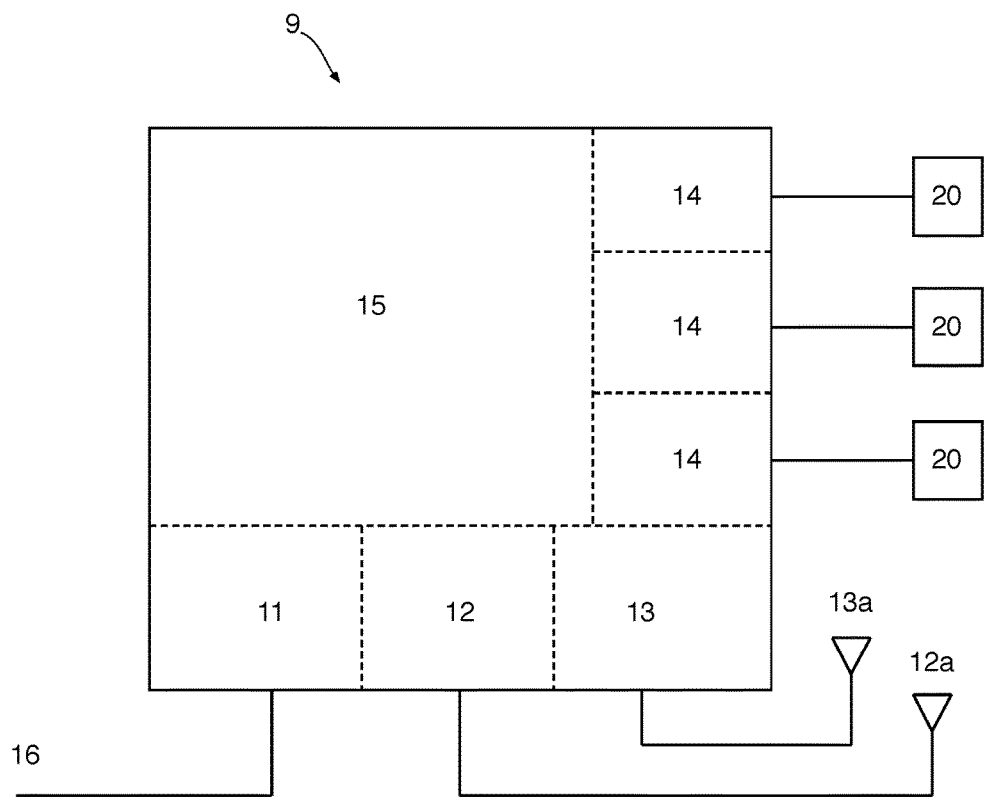
FIG. 1B illustrates a pole mounted detector according to the invention.
Figure 2:
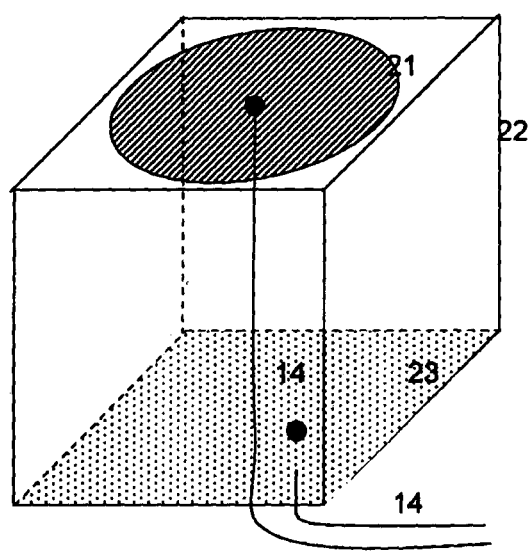
FIG. 2 illustrates a pole mounted electromagnetic sensor according to the invention.

The As shown in FIG. 1A, the detection system consists of a pair of weather proof boxes 3, each mounted to a pole 5 supporting a power distribution line 7, and each including a detector. One of the detectors 9 is illustrated in FIG. 1A Each detector 9 is adapted to be mounted 2 metres up the respective pole 5 at each end of a distribution line section to be monitored. The detector 9 of each box 3 includes:

1) A surge protected uninterrupted power supply 11 (UPS) connected to a 240V 50 Hz low voltage line 16
2) A wireless communications unit 12 with its associated antenna 12A
3) A GPS unit 13 and its associated antenna 13 A to synchronise two sensors many kilometers apart
4) Coaxial cable connections 14 to three sensors 20
5) A data unit 15 consisting of oscilloscope for recording wave forms and an associated processor to record data and store data of significance Each sensor 20 as illustrated in FIG. 2 is an antenna 21 of the dipole type or basically a capacitor in a weather proof housing 22 with one plane 23 grounded to earth. One sensor 20 is disposed below each conductor on the pole about 9 meters above ground and within half a meter of the line. Each antenna has a bandwidth of 1 MHz to 3 GHz.

Software, programmed in Labview™, in the processor, examines the pulses detected by each sensor and stores a maximum and a minimum value. The time of each pulse is also recorded along with the GPS location of the detector. The sensors are looking for high frequency pulses that are indicative of electrical discharges due to shorting of the circuit. Communication means allows the data to be downloaded for analysis.

Software, written in C, on a remote computer at the base station enables stored signals from all sensors to be analysed to calculate the location of the source of each pulse. This location is the distance from one of the pole units, within a tolerance of about 3 to 10 meters 1) Any pulses which take longer than the time for a pulse from one pole unit to the other is discarded as only faults between the units are of interest.
2) Pulses above a certain value only are stored with their location and date
3) The number of pulses recorded at each location over a set time period eg 30 days is counted and stored
4) The information from 3 is displayed to allow a service engineer to select the most likely sites requiring line inspection or in the case of a severe loss of power the likely location of the fault to be repaired.

The oscilloscope may be replaced by data acquisition card using a custom FPGA chip that has the capability of analysing wave functions. The FPGA chip will reduce size and cost of the pole unit. The FPGA may be provided with firmware and software to replace the Labview™ software.

Figure 3:
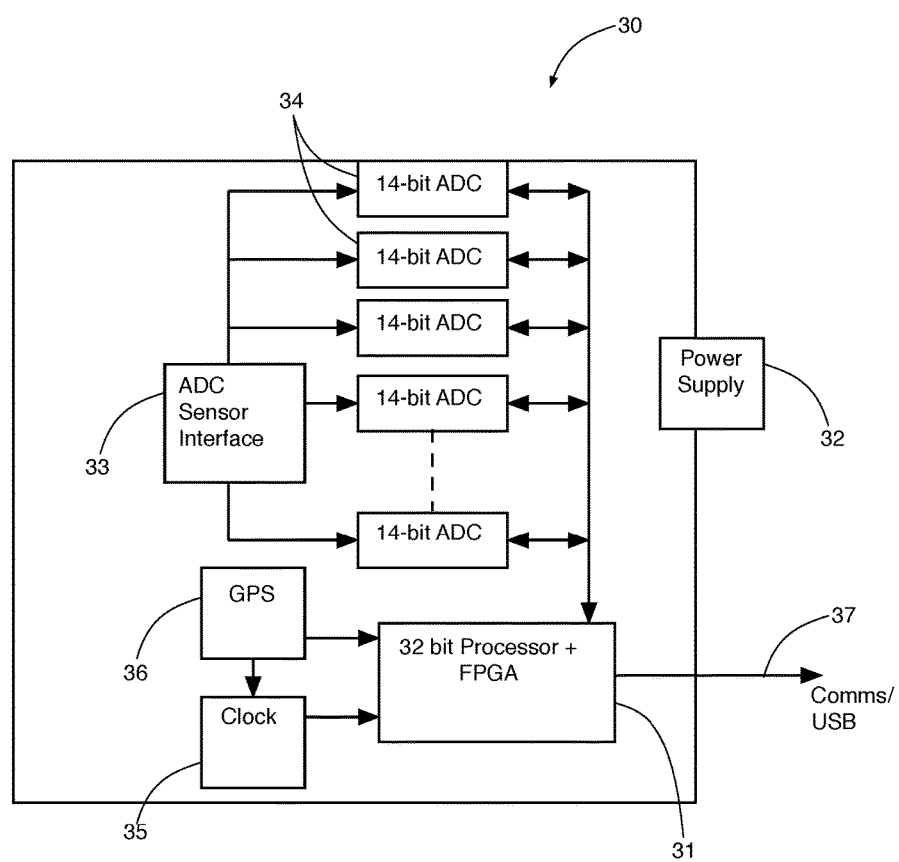
FIG. 3 illustrates a circuit layout of a preferred embodiment of the invention.

A preferred circuit layout 30 for the system is illustrated in FIG. 3. The circuit layout 30 includes a processor 31, which is a microprocessor-based system along with FPGA (field programmable gate array) integrated circuit to control and perform data acquisition and data computation, and a power supply 32. The core system has input/output (I/O) interfaces 33 that interface with a high speed analog-to-digital converter (ADC) 34 which samples inputs from sensors. The system also includes a high precision clock 35 and global positioning system (GPS) module 36 which provide accurate timing information for time synchronisation. The system has the capability of communicating with other systems or a data centre server via wire or wireless communication links 37.

Advantages of this system are:
1. System is capable of "scanning" the line at 1 second or more intervals
2. Detection system calibration may be performed using a pulse injection method via the electromagnetic sensor onto the power line to measure the speed of travelling pulse
3. The system can be deployed in different application areas such as in an underground cable system, a substation/switchyard or an indoor switch-room.
4. Each monitoring system on the pole is time-synchronised independently using GPS. No clear line-of-sight is required.
5. The detection system is able to cover a line of up to 200 km
6. Capable of locating faults based on the maximum and minimum values and time-of-flight or travelling wave algorithm.

Those skilled in the art will realise that this invention provides a unique and low cost solution to the early detection of power line faults. Those skilled in the art will also realise that this invention may be implemented in embodiments other than those shown without departing from the core teachings of this invention.

The invention claimed is:

1. A system for the early detection of faults in a low voltage distribution network, the system comprising:
   at least two detectors, each located on one of two power poles at either end of a section of a power distribution line;
   each detector comprising a GPS unit, an uninterruptable power supply, a communication means to send data to a base station, antenna sensors for each conductor in the power line, each antenna sensor having a bandwidth range of 1 MHz to 3 GHz, and a processor to receive signals from each sensor and collect data relating to a maximum value, a time of maximum value, a minimum value, and a time of minimum value for partial discharge signals within the bandwidth range; and
   the processor or base station being programmed to analyse the collected data to identify in the received signals pulses above a predetermined value and record the number of such pulses at each detector location over a predetermined time interval to enable identification of likely sites of faults in the distribution line.

2. The system as claimed in claim 1, wherein the processor is configured to execute software to statistically analyse the signals from each sensor.

3. The system as claimed in claim 2, wherein information from the statistical analysis allows a service engineer to select the most likely sites requiring line inspection or in the case of a severe loss of power the likely location of the fault to be repaired.

4. The system as claimed in claim 1, wherein the at least two detectors comprises more than two detectors, and the more than two detectors are configured to form a mesh network.

5. The system as claimed in claim 1, wherein each detector is time synchronized using the respective GPS unit with others of the at least two detectors.

* * * * *